United States Patent [19]

Omata

[11] Patent Number: 4,492,459
[45] Date of Patent: Jan. 8, 1985

[54] PROJECTION PRINTING APPARATUS FOR PRINTING A PHOTOMASK

[75] Inventor: Takashi Omata, Yokosuka, Japan

[73] Assignee: Canon Kabushiki Kaisha, Tokyo, Japan

[21] Appl. No.: 458,949

[22] Filed: Jan. 18, 1983

Related U.S. Application Data

[63] Continuation of Ser. No. 229,932, Jan. 30, 1981, abandoned.

[30] Foreign Application Priority Data

Feb. 6, 1980 [JP] Japan ................................ 55-13254

[51] Int. Cl.³ ...................... G03B 27/52; G01B 11/26
[52] U.S. Cl. .................................. 355/43; 355/62; 356/150; 356/401
[58] Field of Search .................. 355/40, 41, 43, 61, 355/62, 63; 356/150, 400, 401; 350/422

[56] References Cited

U.S. PATENT DOCUMENTS

| | | | |
|---|---|---|---|
| 3,897,138 | 7/1975 | Kano | 350/422 |
| 4,170,418 | 10/1979 | Aiuchi et al. | 356/375 |
| 4,251,160 | 2/1981 | Bouwhuis et al. | 356/150 |
| 4,269,505 | 5/1981 | Mayer | 355/62 |
| 4,295,735 | 10/1981 | Lacombat et al. | 355/63 |

Primary Examiner—A. A. Mathews
Attorney, Agent, or Firm—Fitzpatrick, Cella, Harper & Scinto

[57] ABSTRACT

A projection printing apparatus uses different lens systems during alignment and during printing. The lens system for alignment causes an alignment mark on mask to be imaged on the alignment mark on a wafer when the mask is illuminated by non-sensitizing light. The lens system for printing causes the circuit pattern of the mask to be illuminated by sensitizing light to be imaged on the wafer. The whole or part of the lens system for alignment is positioned outside of the circuit pattern image forming light path so as not to adversely affect the circuit pattern image on the wafer when the mask is illuminated by the sensitizing light.

6 Claims, 9 Drawing Figures

PROJECTION PRINTING APPARATUS FOR PRINTING A PHOTOMASK

This is a continuation of application Ser. No. 229,932, filed Jan. 30, 1981, now abandoned.

BACKGROUND OF THE INVENTION

1. Field of the Invention

This invention relates to a projection printing apparatus for printing a photomask on a wafer, by the use of a projection lens, in the manufacture of integrated circuits.

2. Description of the Prior Art

A method of printing a photomask on a wafer in the manufacture of integrated circuits is known in which printing is carried out with the mask and the wafer superposed one upon the other, with a printing projection system disposed between the mask and the wafer so that projection exposure is effected thereby, and in which the mask and the wafer are scanned on an arcuate slit-like picture plane area by the use of a mirror optical system to thereby effect exposure. Particularly, recently, it is increasingly necessary to print minute circuit patterns and for that reason, attention has been paid to projection exposure systems using a lens having a high resolving power. However, a lens having such a high resolving power and capable of printing the entire surface of a wafer having dimensions of four or five inches at one time is difficult to designs and manufacture. Accordingly, where a wafer of large diameter is to be printed by the use of this system, there has been proposed a method whereby the exposure area EA on the wafer is divided into several rectangular areas RA is shown, for example, in FIG. 1 of the accompanying drawings, and these rectangular areas are successively exposed to light to thereby complete the exposure of the entire wafer surface.

Now, when a photomask is to be thus printed on a wafer in the integrated circuit manufacturing process, it is necessary to observe a pattern already formed on the wafer in the previous step of the process and a portion of the photomask to be next printed, at the same time, and to adjust the position of the photomask or the wafer until they assume a predetermined positional relation, namely, to effect alignment. At that time, the wafer is observed through a projection lens and the illumination light therefore must be a light of a such a wavelength to which the photoresist applied onto the wafer is not sensitized. Also, where a mechanism for automatically effecting alignment is used, it becomes necessary to cause a light of a different wavelength such as laser light to be imaged through the projection lens. However, the printing projection lens so used for the manufacture of integrated circuits is required to be highly aberration-corrected in order to print minute patterns. However, it is difficult to correct the aberrations for light of numerous wavelengths by the use of presently available optical materials.

For this reason, the applicant proposed, in U.S. Pat. No. 3,897,138, a projection printing method whereby different imaging optical systems are inserted between the mask and the wafer during printing and during alignment.

This method, however, has suffered from a problem in adjustment of the optical axis which results from the interchange of the imaging optical systems.

SUMMARY OF THE INVENTION

The present invention has been made in view of the above-noted problem and an object of the invention is to provide an improved projection printing apparatus which uses different imaging optical systems during alignment and during printing.

For this purpose, in the apparatus of the present invention, an optical system for printing and an optical system for alignment are brought into a fixed relation, and the alignment mark portion of a mask illuminated by non-sensitizing light is effected by the optical system for alignment and the circuit pattern portion illuminated by sensitizing light is effected by the optical system for printing.

The invention will become more fully apparent from the following detailed description thereof taken in conjunction with the accompanying drawings.

DESCRIPTION OF THE PREFERRED EMBODIMENTS

The embodiments of the present invention will hereinafter be described with reference to the drawings. It is to be noted that the following embodiments are ones in which the printing optical system and the alignment optical system are not entirely separate from each other but have elements common to each other.

Figure 1:
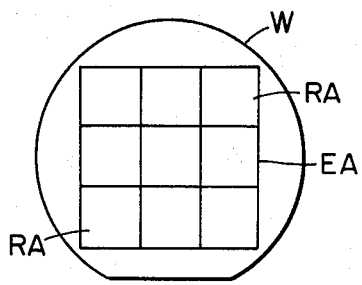
FIG. 1 illustrates a wafer used in the divisional exposure system.
Figure 2:
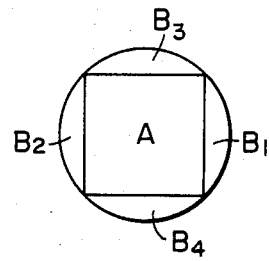
FIG. 2 shows the view field of a lens.

Also, in the printing apparatus of the following embodiment the areas printed at one time are, for example, individual rectangles as shown in and described previously with reference to FIG. 1. Generally, the effective picture plane area of a lens is circular as shown in FIG. 2, but only the area designated by A is acted on for the printing. That is, a circuit pattern is formed on the area of a mask corresponding to this area, and the circuit pattern of the mask is formed on the portion of a wafer corresponding to this area.

Figure 3:
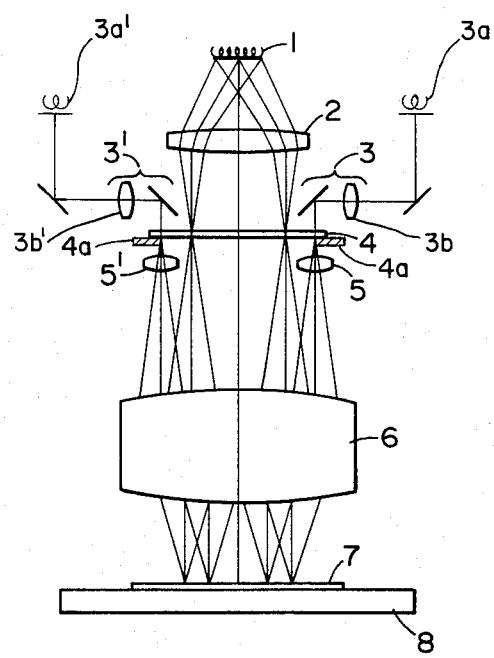
FIG. 3 shows the optical arrangement according to a first embodiment of the present invention.

A first embodiment of the present invention will hereinafter be described by reference to FIG. 3.

Figure 4:
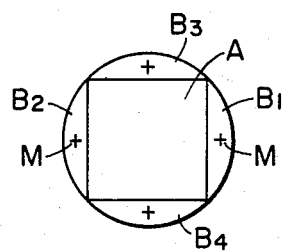
FIG. 4 illustrates the mask of FIG. 3.

Designated by 1 is a sensitive printing light source such as an ultra-high pressure mercury lamp. This light source 1 illuminates a mask during printing. Denoted by 2 is a condenser lens. Reference numerals 3 and 3' designate observation optical systems each including a non-sensitive illumination source $3a$ and $3a'$ and an observation system which may comprise lenses $3b$ and $3b'$ respectively for illuminating and observing therethrough the alignment mark portions of the mask. Designated by 4 is the mask supported by a suitable support structure $4a$. This mask, as shown in FIG. 4, has a circuit pattern formed on an area A and has alignment marks M formed on areas $B_1$, $B_2$. The area A is illuminated by the sensitizing light from the condenser lens, and the alignment mark portion is illuminated by non-sensitizing light from the source 3a and 3a' through the illuminating optical system 3 and 3' during alignment. Denoted by 5 and 5' are lens elements or correcting optical elements which, with a common imaging lens 6, form an alignment mark projection optical system. These elements 5 and 5' must be disposed outside of the projection light path of the circuit pattern area A of the mask 4. Accordingly, it is desirable that they be provided between the mask and wafer and in opposed relationship with the mark M portion $B_1$ and $B_2$. Designated by 6 is a projection lens. This lens is sufficiently aberration-corrected with respect to the sensitizing light. For example, the projection lens 6 has the aberrations therein corrected with respect to wavelength 436 mm or 405 mm which is the bright line spectrum of the ultra-high pressure mercury lamp or the light of both wavelengths. Accordingly, the circuit pattern of the mask is imaged on a wafer 7 substantially in aberration-free condition. On the other hand, when the marks M are projected upon the wafer 7 only through the projection lens 6, defocus or magnification deviation will occur correspondingly to the wavelength of the non-sensitizing light. Accordingly, the optical elements 5 and 5' correct such magnification deviation or defocus. These correcting optical elements 5 and 5' are each comprised of a single lens, a doublet or sometimes a mere parallel planar plate. Each correcting optical element 5 or 5' and the projection lens 6 are mounted integrally together in a lens barrel, not shown. Designated by 8 is a carriage on which the wafer 7 is placed and which is adjustable in directions x, y and $\theta$.

The present embodiment is constructed as described above and therefore, the mark M portion $B_1$ and $B_2$ are illuminated by non-sensitizing light. The projection lens 6 and the correcting elements 5 and 5' are fixed with respect to the mask. By this illumination, the marks M are projected upon the wafer 7 through the alignment optical systems 5, 6 and 5', 6. The alignment marks and the images of the marks M on the wafer 7 are observed through the observation systems 3b and 3b' while moving the wafer supporting carriage 8 in directions x, y and $\theta$, thereby effecting alignment procedure. After the alignment has been terminated, the light source 1 is turned on and the circuit pattern is projected by the printing optical system 6 on to the wafer 7, thereby effecting printing.

In the present embodiment, the alignment marks M are provided only at locations $B_1$ and $B_2$ as shown in FIG. 4, but alternatively they may be provided at locations $B_3$ and $B_4$.

Figure 5:
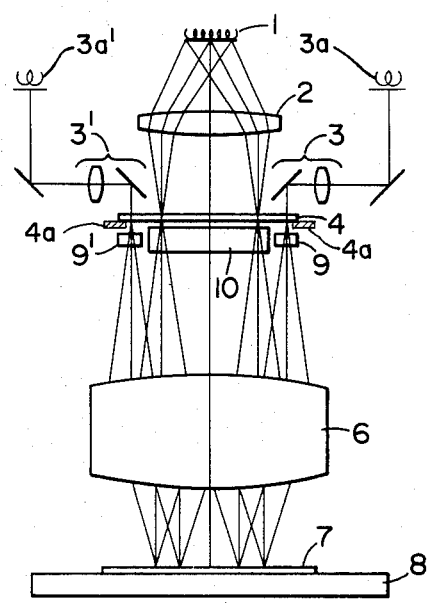
FIGS. 5 and 6 illustrate a second embodiment of the present invention.

In the first embodiment, the correcting optical system is provided in the alignment optical system, but alternatively, the correcting optical system may be provided both in the alignment optical system and the printing optical system. Such embodiment will be described by reference to FIG. 5.

Figure 6:
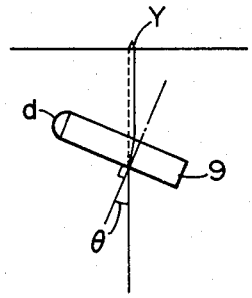

Designated by 9, 9', and 10 are parallel planar plates forming the correcting optical system. The printing light passes through the parallel planar plate 10 and the light from sources 3a and 3a' imaging the alignment marks passes through the parallel planar plates 8 and 9'. The parallel planar plates 9, 9' and 10 differ in thickness, and the thicknesses thereof are determined so as to correct the difference in focus position of the projection lens for the light used for printing and light used for alignment which results from the difference in wavelength between these lights. Also, the imaged position of the alignment pattern may be deviated from a predetermined position in the imaging plane by the chromatic aberration of the projection lens or the assembly error of the optical system. Such lateral deviation of the pattern position can be corrected by adjusting the inclination of the parallel planar plates 9 and 9'. The method therefor will be described by reference to FIG. 6. Each parallel planar plate 9 or 9' is generally disposed so that the normal thereto is parallel to the optical axis, and by causing this normal to be inclined with respect to the optical axis, the image of the alignment pattern formed on the mask can be moved laterally in the imaging plane. When the inclination of the normal is sufficiently small, the movement amount Y(mm) of the pattern image is expressed by the following equation:

$$Y = \frac{N-1}{N} d \cdot \theta$$

where $\theta$(inradians) is the angle of inclination of the normal, d(mm) is the thickness of the parallel planar plate, and N is the refractive index of the parallel planar plate.

Figure 7:
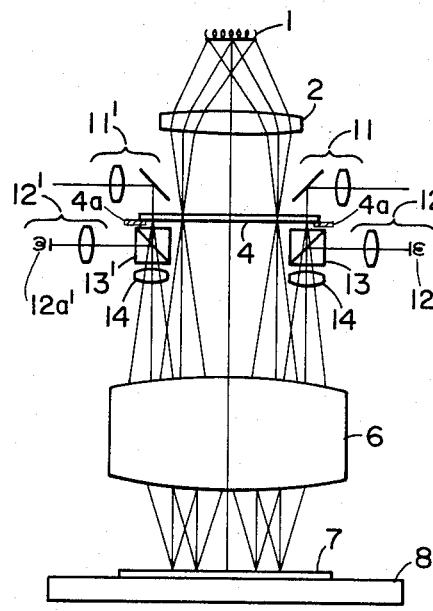
FIG. 7 shows the optical arrangement according to a third embodiment of the present invention.

FIG. 7 shows still another embodiment. Designated by 11 and 11' are alignment pattern detecting optical systems. Denoted by 12 and 12' are illuminating optical systems including illuminating sources 12a and 12a' for alignment pattern detection. Reference numerals 13 and 13' designate beam splitters disposed in the light path between the mask 4 and the projection lens 6 to direct the illumination lights from the illuminating optical systems 12 and 12' onto the wafer 7. Designated by 14 and 14' are aberration correcting optical elements. The other members are constructed in the same manner as in the previous embodiment. In the previous embodiment, the illumination for alignment pattern detection has been effected by causing the light to pass from the upper surface of the mask through the mask. However, in that case part of the illumination light is reflected by the mask surface and directly returns into the detecting system and such light, so that the wafer pattern detecting ability is reduced. In the present embodiment, to solve such problem, the beam splitters 13 and 13' are disposed in the light path between the mask 4 and the projection lens 6, and the wafer surface is illuminated by the illuminating optical systems 12 and 12' through the beam splitters 13 and 13' respectively. In this case, the reflected light from the mask surface is not directed to the detecting optical system 11 and the wafer pattern detecting ability is not reduced.

Figure 8:
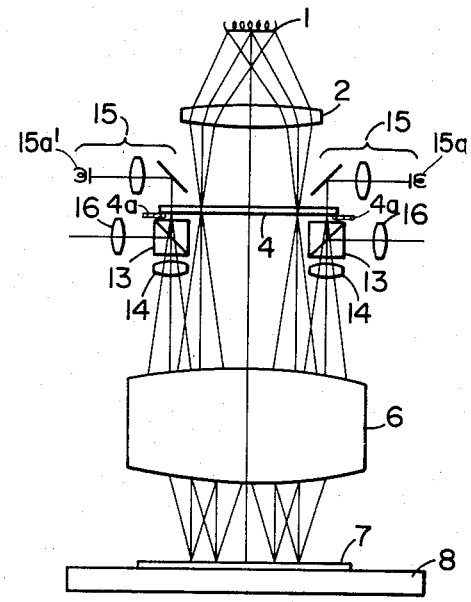
FIG. 8 shows the optical arrangement according to a fourth embodiment of the present invention.

FIG. 8 shows yet another embodiment. Designated by 15 and 15' are illuminating optical systems including illuminating sources 15a and 15a' for alignment. Denoted by 16 and 16' are pattern detecting optical systems for alignment. The other members are constructed in the same manner as in the embodiment of FIG. 7. In this embodiment, the illumination of the alignment pattern in effected by causing the light to pass from the upper surface of the mask through the mask, and the detection of the alignment pattern in effected by the detecting optical systems 16 through the beam splitters 13. Again in this embodiment, as in the embodiment of FIG. 7, the reflected light from the mask surface is not directed to the detecting optical systems 16 and thus, the wafer pattern detecting ability is not reduced.

Figure 9:
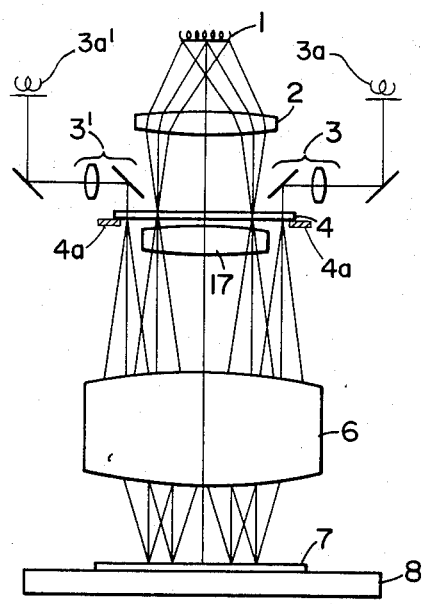
FIG. 9 shows the optical arrangement according to a fifth embodiment of the present invention.

FIG. 9 shows a further embodiment. This embodiment differs from the embodiment of FIG. 3 in that no aberration correcting optical system is disposed in the light beam for imaging the alignment mark and that an aberration correcting optical system 17 is disposed in the light beam used for printing, and is the same as the embodiment of FIG. 3 in the other points. In this embodiment, a lens having the aberrations therein corrected for the wavelength of the light for imaging the alignment mark is used as the projection lens 6. Accordingly, the projection lens 6 has the aberrations therein insufficiently corrected for the wavelength of the light used for printing and therefore, an aberration correcting optical system 17 is disposed on the printing light beam to effect aberration correction. The aberration correcting optical system 17 is actually comprised of a single lens or a doublet or sometimes ordinary optical glass such as a parallel planar plate. By so constructing the aberration correcting optical system, good aberration correction can be accomplished with respect to both of the printing light beam and the alignment mark imaging light beams as in the previously described embodiment, thus achieving the object of the present invention.

In the embodiment hitherto described, the aberration correcting optical system is disposed in the light path between the mask and the printing projection lens, but alternatively, the aberration correcting optical system may be disposed in the light path between the wafer and the projection lens to obtain entirely the same effect. In the foregoing description, the application of the present invention to the divisional exposure type projection printing apparatus has been chiefly described, but it will be apparent that the present invention may be used in one shot exposure type projection printing apparatus.

Thus, the present invention provides a mask pattern projection printing apparatus which utilizes the effective picture plane area of the projection lens not used for exposure in a mask pattern printing apparatus and which is provided with means for effecting aberration correction for the light of a wavelength different from that of the light used for printing and which enables a quick exposure process and is capable of maintaining high alignment accuracy.

What I claim is:

1. Projection printing apparatus for printing images carried on a photomask onto a wafer alignable with the photomask, comprising:
    photomask supporting means for supporting a photomask having a circuit pattern image and an alignment pattern image thereon;
    wafer supporting means for supporting a wafer for receiving a circuit pattern image and an alignment pattern image projected thereto;
    an image projection optical system having an image field sufficiently large to project both the circuit pattern image and the alignment pattern image from the photomask to the wafer;
    light source means for illuminating the photomask with non-sensitizing light during alignment of the photomask and wafer and for illuminating the photomask with sensitizing light during printing of the wafer with the images; and
    an alignment pattern imaging system, cooperating with the image projection optical system, to form on the wafer the alignment image of the photomask illuminated by the non-sensitizing light.

2. An apparatus according to claim 1, wherein said alignment pattern imaging system and said image projection optical system have portions in common and portions not in common and wherein said portions not in common are positioned adjacent at least one of the photomask and the wafer.

3. An apparatus according to claim 1, wherein at least one of the photomask and the wafer is movable relative to the other.

4. Projection printing apparatus for printing images carried on a photomask onto a wafer alignable with the photomask, comprising:
    photomask supporting means for supporting a photomask having a circuit pattern image and an alignment pattern image thereon;
    wafer supporting means for supporting a wafer for receiving a circuit pattern image and an alignment pattern image projected thereto;
    an image projection optical system having an image field sufficiently large to project both the circuit pattern image and the alignment pattern image from the photomask to the wafer;
    light source means for illuminating the photomask with non-sensitizing light during alignment of the photomask and wafer and for illuminating the photomask with sensitizing light during printing of the wafer with the images; and
    a circuit pattern imaging system, cooperating with the image projection optical system, to form on the wafer the circuit pattern image of the photomask illuminated by the sensitizing light to print the circuit pattern image thereon.

5. Projection printing apparatus for printing images carried on a photomask onto a wafer alignable with the photomask, comprising:
    photomask supporting means for supporting a photomask having a circuit pattern image and an alignment pattern image thereon;
    wafer supporting means for supporting a wafer for receiving a circuit pattern image and an alignment pattern image projected thereto;
    an image projection optical system having an image field sufficiently large to project both the circuit pattern image and the alignment pattern image from the photomask to the wafer;
    first light source means for illuminating the photomask with sensitizing light of predetermined wavelength during printing of the wafer with the images;
    second light source means for illuminating the photomask with light of another wavelength during alignment of the photomask and wafer; and
    an alignment pattern imaging system, cooperating with the image projection optical system, to form on the wafer the alignment image of the photomask illuminated by the light from said second light source.

6. Projection printing apparatus for printing images carried on a photomask onto a wafer alignable with the photomask, comprising:
    photomask supporting means for supporting a photomask having a circuit pattern image and an alignment pattern image thereon;
    wafer supporting means for supporting a wafer for receiving a circuit pattern image and an alignment pattern image projected thereto,
    an image projection optical system having an image field sufficiently large to project both the circuit pattern image and the alignment pattern image from the mask to the wafer;
    first light source means for illuminating the photomask with sensitizing light of predetermined wavelength during printing of the wafer with the images;

second light source means for illuminating the photomask with light of another wavelength during alignment of the photomask and wafer; and a circuit pattern imaging system, cooperating with the image projection optical system, to form on the wafer the circuit pattern image of the photomask illuminated by the light from said first light source to print the circuit pattern image thereon.

* * * * *